(12) United States Patent
Watanabe

(10) Patent No.: US 7,804,123 B2
(45) Date of Patent: Sep. 28, 2010

(54) NONVOLATILE SEMICONDUCTOR MEMORY

(75) Inventor: Shoichi Watanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 11/958,732

(22) Filed: Dec. 18, 2007

(65) Prior Publication Data
US 2008/0142870 A1 Jun. 19, 2008

(30) Foreign Application Priority Data
Dec. 19, 2006 (JP) ............................. 2006-341762

(51) Int. Cl.
*H01L 29/788* (2006.01)
(52) U.S. Cl. .................. 257/316; 257/315; 257/317; 257/325; 257/E21.209; 257/E21.422; 257/E21.682; 257/E21.69; 257/E27.103; 257/E29.3
(58) Field of Classification Search ............. 257/316, 257/317, 321, 325, 389, E21.209, E29.132, 257/E29.133
See application file for complete search history.

(56) References Cited

U.S. PATENT DOCUMENTS

| 6,133,601 A * | 10/2000 | Watanabe | 257/314 |
| 6,259,131 B1 * | 7/2001 | Sung et al. | 257/315 |
| 6,465,837 B1 * | 10/2002 | Wu | 257/315 |
| 6,774,430 B2 * | 8/2004 | Horiguchi et al. | 257/316 |
| 7,294,878 B2 * | 11/2007 | Tanaka et al. | 257/296 |
| 2005/0006696 A1 * | 1/2005 | Noguchi et al. | 257/316 |
| 2005/0045941 A1 * | 3/2005 | Kurita et al. | 257/315 |
| 2007/0122968 A1 * | 5/2007 | Sim et al. | 438/243 |

FOREIGN PATENT DOCUMENTS

| JP | 2002-184875 | 6/2002 |
| JP | 2003-318290 | 11/2003 |

* cited by examiner

*Primary Examiner*—Matthew E Warren
*Assistant Examiner*—David Spalla
(74) *Attorney, Agent, or Firm*—Turocy & Watson, LLP

(57) ABSTRACT

A nonvolatile semiconductor memory according to an example of the present invention includes first and second diffusion layers, a channel formed between the first and second diffusion layers, a gate insulating film formed on the channel, a floating gate electrode formed on the gate insulating film, an inter-gate insulating film formed on the floating gate electrode, and a control gate electrode formed on the inter-gate insulating film. An end portion of the inter-gate insulating film in a direction of channel length is on an inward side of a side surface of the floating gate electrode or a side surface of the control gate electrode.

18 Claims, 15 Drawing Sheets

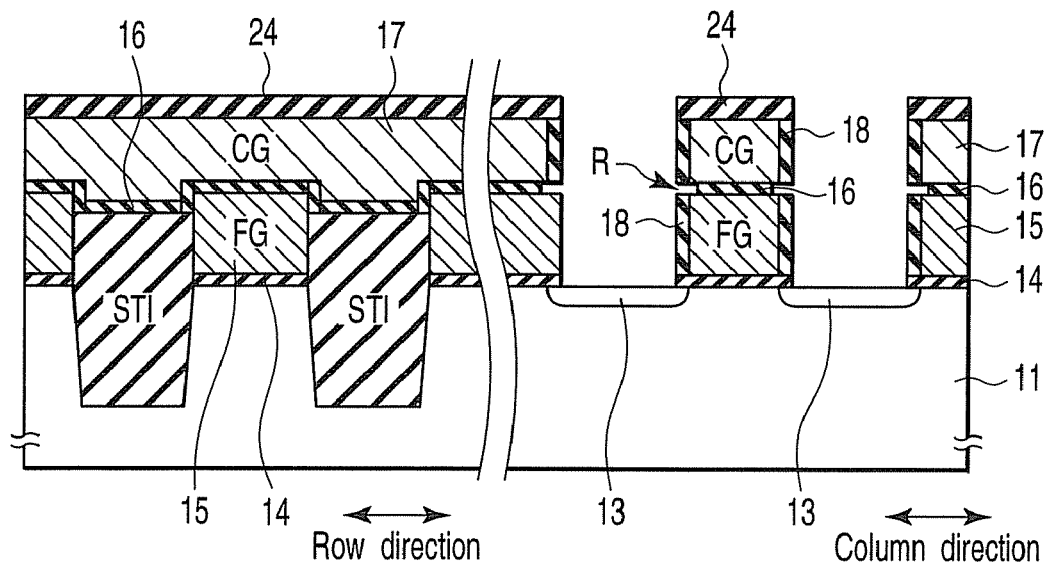
F I G. 24
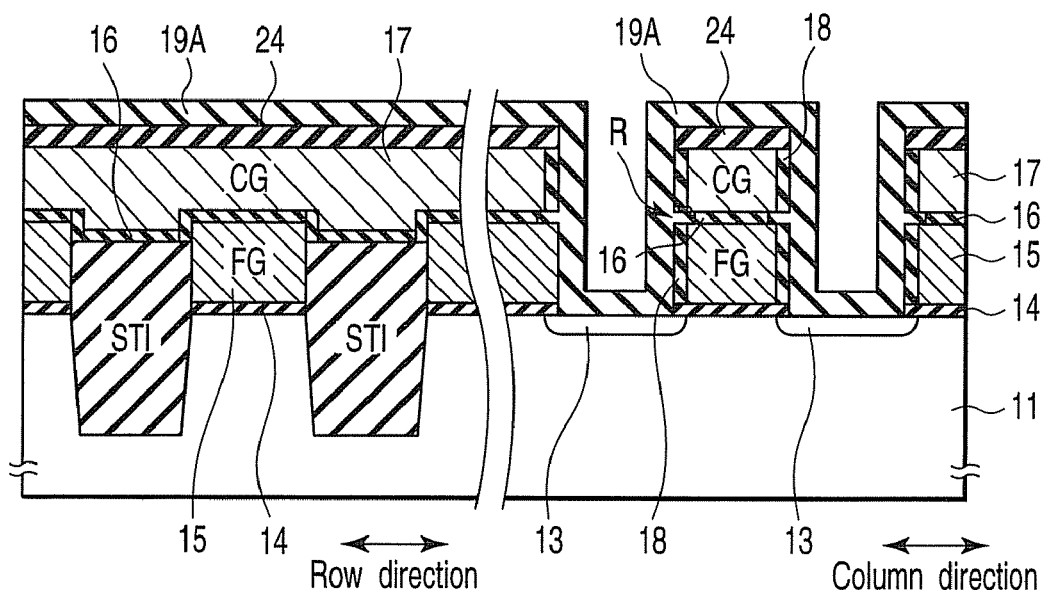
F I G. 25

NONVOLATILE SEMICONDUCTOR MEMORY

CROSS-REFERENCE TO RELATED APPLICATIONS

This application is based upon and claims the benefit of priority from prior Japanese Patent Application No. 2006-341762, filed Dec. 19, 2006, the entire contents of which are incorporated herein by reference.

BACKGROUND OF THE INVENTION

1. Field of the Invention

The present invention relates to an inter-gate insulating film of a memory cell having a stack gate structure.

2. Description of the Related Art

As a structure of a memory cell of a nonvolatile semiconductor memory, there is known a structure in which a floating gate electrode and a control gate electrode are stacked on a gate insulating film. Such a structure is called a stack gate structure (for example, see Jpn. Pat. Appln. KOKAI Publication No. 2002-184875).

Data is written in a memory cell of the stack gate structure in such a manner that electric charges are injected into a floating gate electrode to increase a threshold voltage of the memory cell to a predetermined value. Data is erased on the memory cell in such a manner that electric charges are extracted from the floating gate electrode to decrease the threshold voltage of the memory cell to a predetermined value.

For example, when a NAND flash memory is used as an example, in writing, a write potential of 17V or more is applied to a control gate electrode while keeping a channel of a memory cell (FET) at 0V, and an FN tunnel current is caused to flow from the floating gate electrode to the channel.

In erasing, an erase potential of 16V or more is applied to a semiconductor substrate while keeping the control gate electrode at 0V, and an FN tunnel current is caused to flow from the channel of the memory cell to the floating gate electrode.

In this case, in order to improve writing/erasing efficiency, a coupling ratio of the memory cell must be improved.

In recent years, in order to improve the coupling ratio, as a material of an inter-gate insulating film arranged between a floating gate electrode and a control gate electrode, a material having a higher dielectric constant than silicon oxide ($SiO_2$), such as ONO (oxide/nitride/oxide) or a high dielectric constant (High-k) material is used as a mainstream.

The coupling ratio can be improved by thinning the inter-gate insulating film.

However, when micropatterning of a memory cell is advanced, the above means causes a problem of an increase in leakage current generated in the inter-gate insulating film in writing/erasing, a problem of dielectric breakdown of the inter-gate insulating film, and the like.

BRIEF SUMMARY OF THE INVENTION

A nonvolatile semiconductor memory according to an aspect of the present invention comprises first and second diffusion layers, a channel formed between the first and second diffusion layers, a gate insulating film formed on the channel, a floating gate electrode formed on the gate insulating film, an inter-gate insulating film formed on the floating gate electrode, and a control gate electrode formed on the inter-gate insulating film. An end portion of the inter-gate insulating film in a direction of channel length is on an inward side of a side surface of the floating gate electrode or a side surface of the control gate electrode.

A nonvolatile semiconductor memory according to an example of the present invention comprises first and second diffusion layers, a channel formed between the first and second diffusion layers, a gate insulating film formed on the channel, a floating gate electrode formed on the gate insulating film, an inter-gate insulating film formed on the floating gate electrode, and a control gate electrode formed on the inter-gate insulating film. An end portion of the inter-gate insulating film in a direction of channel length is matched with a side surface of the floating gate electrode or a side surface of the control gate electrode.

BRIEF DESCRIPTION OF THE SEVERAL VIEWS OF THE DRAWING

FIG. 24 is a sectional view showing one step of the manufacturing method;

FIG. 25 is a sectional view showing one step of the manufacturing method;

DETAILED DESCRIPTION OF THE INVENTION

Figure 1:
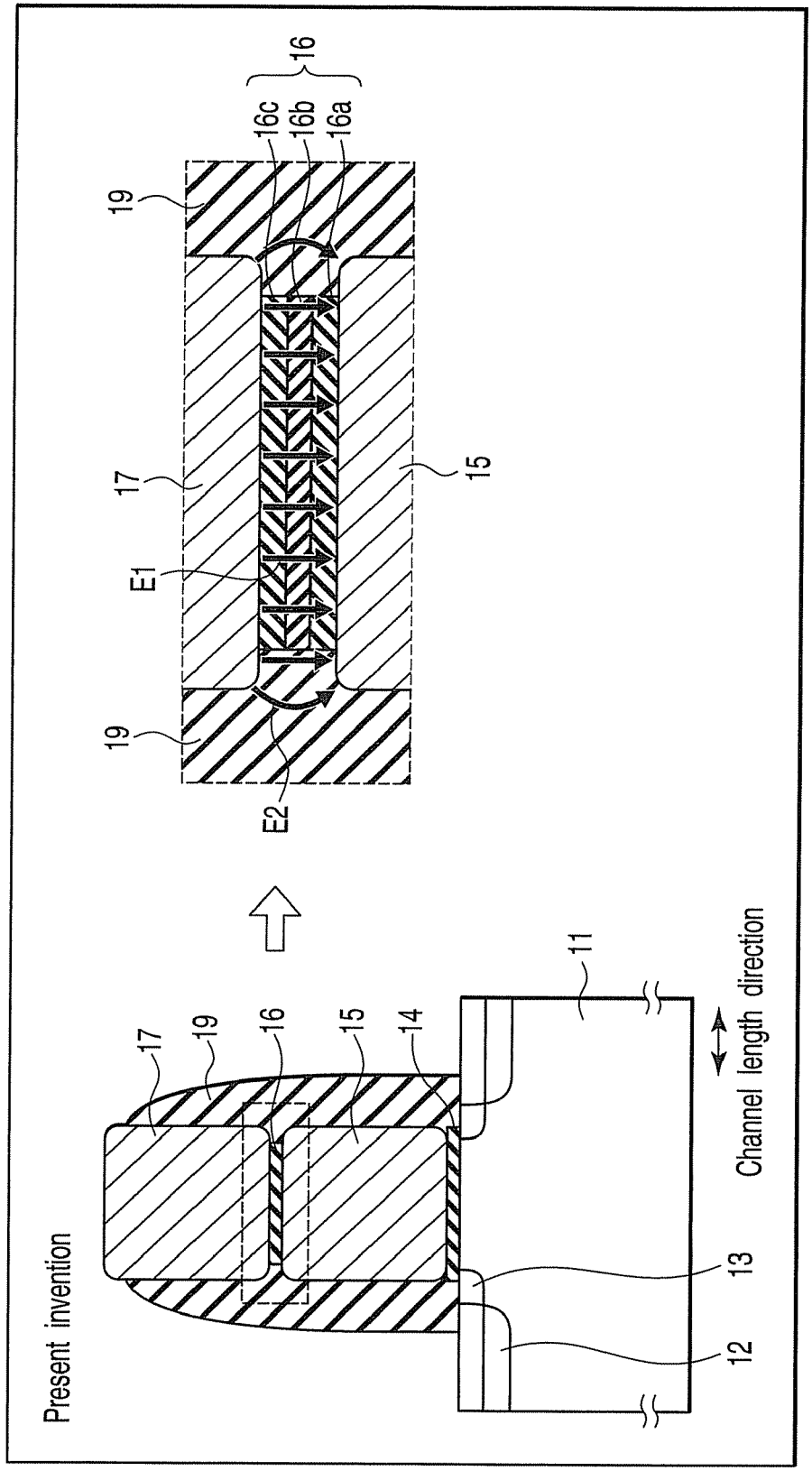
FIG. 1 is a sectional view showing a device structure according to an example of the present invention.

A nonvolatile semiconductor memory of an aspect of the present invention will be described below in detail with reference to the accompanying drawings.

1. Outline

An example of the present invention relates to a structure of an inter-gate insulating film of a memory cell having a stack gate structure. A leakage current generated in the inter-gate insulating film and dielectric breakdown of the inter-gate insulating film are mainly generated between an edge of a floating gate electrode and an edge of a control gate electrode.

The leakage current or the dielectric breakdown are caused by the fact that an electric field generated between these edges (to be referred to as an edge electric field) is larger than an electric field generated between planar portions of the both electrodes, and by the fact that a high dielectric constant inter-gate insulating film is arranged between the edges.

In particular, with respect to the inter-gate insulating film, after the floating gate electrode and the control gate electrode are processed, an oxidization step of oxidizing the surfaces of the electrodes must be performed. For this reason, in this structure, the inter-gate insulating film projects outward from a side surface of the floating gate electrode or a side surface of the control gate electrode.

The embodiment of the present invention proposes the following new structure. That is, an end portion of the inter-gate insulating film of the memory cell in a direction of channel length is matched with the side surface of the floating gate electrode or the side surface of the control gate electrode, or is on the inward side of the electrode.

In this case, between the edge of the floating gate electrode and the edge of the control gate electrode, an area (for example, a side-wall insulating film, a void, or the like) having a dielectric constant lower than that of the inter-gate insulating film can be formed. For this reason, no edge electric field is applied to the inter-gate insulating film.

Therefore, even though a coupling ratio is improved by an increase in dielectric constant of the inter-gate insulating film and a decrease in thickness thereof, an increase in leakage current generated in the inter-gate insulating film and dielectric breakdown of the inter-gate insulating film are not generated.

2. Concerning Coupling Ratio and Leakage Current Generated in Inter-Gate Insulating Film A relationship between a coupling ratio and a leakage current generated in an inter-gate insulating film will be described below.

In this case, the inter-gate insulating film is an insulating film which is arranged in at least a center area of an area between the floating gate electrode and the control gate electrode and which continues in a direction parallel to a surface opposing both the electrodes.

When both the floating gate electrode and the control gate electrode consist of conductive polysilicon, the inter-gate insulating film is called an IPD (inter-layer polysilicon dielectric).

The structure of the memory cell must be optimized to satisfy writing/erasing characteristics. One of important items expressing the writing/erasing characteristics is writing/erasing time.

In order to shorten writing/erasing time, an FN tunnel current may be increased.

A magnitude of the FN tunnel current depends on the film thickness of a tunnel oxide film (gate insulating film) and a magnitude of an electric field applied to the tunnel oxide film. More specifically, when the tunnel oxide film is thinned or the electric field applied to the tunnel oxide film is increased, the writing/erasing time can be shortened.

However, when the tunnel oxide film is thinned, the tunnel oxide film is increasingly damaged by the tunnel current. For this reason, the memory cell is deteriorated in reliability. Therefore, the tunnel oxide film is not adequately thinned.

For this reason, it is examined that an electric field applied to the tunnel oxide film is increased. For this purpose, for example, a potential of the floating gate electrode in writing may be increased.

The potential of the floating gate electrode in writing is determined by a coupling ratio.

The coupling ratio is a value depending on a ratio of a capacitance $C\_tunnel$ generated between a semiconductor substrate and a floating gate electrode to a capacitance $C\_IPD$ generated between the floating gate electrode and a control gate electrode. When the coupling ratio is represented by CR, it is given by the following expression:

$$CR = C\_IPD/(C\_tunnel + C\_IPD)$$

By using the coupling ratio CR, a potential $V\_fg$ of the floating gate electrode when a write potential given to the control gate electrode is given by $V\_pgm$ is given by the following equation:

$$V\_fg = V\_pgm \times CR$$

More specifically, when the coupling ratio is increased, the potential of the floating gate electrode increases. For this reason, as a result, an electric field applied to a tunnel oxide film also increases, and writing characteristics are improved.

The conditions are also applied to the erasing characteristics.

However, when the coupling ratio is increased, a leakage current generated in the inter-gate insulating film disadvantageously increases.

The leakage current generated in the inter-gate insulating film affects the maximum/minimum threshold voltage (saturated threshold voltage) of the memory cell. More specifically, the maximum/minimum threshold voltage of the memory cell is determined by a quantity of electric charge in the floating gate electrode obtained when an FN tunnel current flowing in the tunnel oxide film and a leakage current flowing in the inter-gate insulating film are matched with each other.

Therefore, when the leakage current generated in the inter-gate insulating film increases, it is difficult that the threshold voltage of the memory cell falls in a predetermined range in writing/erasing. For this reason, the coupling ratio cannot be endlessly increased.

In this manner, improvement of the coupling ratio (writing/erasing rate) and a decrease in leakage current generated in the inter-gate insulating film (maximum/minimum threshold voltage) have a trade-off relation.

In this case, as a technique of improving a coupling ratio without increasing the leakage current generated in the inter-gate insulating film, a technique of increasing an area where the floating gate electrode and the control gate electrode face each other is known.

For example, a floating gate electrode is made columnar, the height of the floating gate is increased, and an entire upper surface of the floating gate electrode and a part of a side surface of the floating gate electrode are covered with the control gate electrode. In this case, the inter-gate insulating film is increased in thickness without decreasing the coupling ratio, so that a leakage current generated in the inter-gate insulating film can be reduced.

However, the technique cannot cope with micropatterning of a memory cell.

More specifically, surfaces facing adjacent floating gate electrodes increase in area, when the floating gate electrodes are columnar. For this reason, a capacitance between the floating gates increases, and a shift of a threshold voltage caused by interference (to be referred to as inter-cell interference) between floating gates of two adjacent memory cells increases. This is because the inter-cell interference becomes conspicuous when the memory cell is micropatterned.

In contrast to this, according to the embodiment of the present invention, when only the structure of an inter-gate insulating film is changed without changing the structure of an entire memory cell, the coupling ratio can be improved without an increase in leakage current generated in the inter-gate insulating film and dielectric breakdown of the inter-gate insulating film.

Furthermore, according to the cell structure in the example of the present invention, inter-cell interference can be reduced in comparison with a columnar floating gate electrode. For this reason, the cell structure is advantageous to micropatterning of a memory cell.

3. Embodiment

An embodiment of the present invention will be described below.

(1) Device Structure

FIG. 1 shows a device structure of a memory cell according to an example of the present invention.

On a surface region of a semiconductor substrate 11, a source/drain diffusion layer 12 and an extension diffusion layer 13 are formed. A gate insulating film (tunnel oxide film) 14 formed on a channel between extension diffusion layers 13.

On the gate insulating film 14, a floating gate electrode 15 in an electric floating state is formed. The floating gate electrode 15 consists of conductive polysilicon, metal, or silicide.

On the floating gate electrode 15, an inter-gate insulating film 16 is formed. The inter-gate insulating film 16 consists of an silicon oxide 16a, a silicon nitride 16b, and a silicon oxide 16c. The inter-gate insulating film 16 is not limited to this configuration, and may consist of any insulating material having a dielectric constant higher than that of silicon oxide.

On the inter-gate insulating film 16, a control gate electrode (word line) 17 is formed. The control gate electrode 17 consists of conductive polysilicon, metal, silicide, or a lamination layer thereof.

Edges of the floating gate electrode 15 and the control gate electrode 17 have a round form. An electrical concentration of an area between the floating gate electrode 15 and the control gate electrode 17 weaken by the round form. A side-wall insulating film (for example, silicon oxide or the like) 19 is formed on a side surface of the floating gate electrode 15 and a side surface of the control gate electrode 17.

In this case, in the example of the present invention, an end portion of the inter-gate insulating film 16 in a direction of channel length is matched with the side surface of the floating gate electrode 15 or the side surface of the control gate electrode 17, or is on the inward side of the electrode.

The side-wall insulating film 19 is filled in an area adjacent to the end portion of the inter-gate insulating film 16 in a direction of channel length, i.e., an area between the edge of the floating gate electrode 15 and the edge of the control gate electrode 17.

Therefore, an edge electric field E2 is not applied to the inter-gate insulating film 16. The side-wall insulating film 19 applied with the edge electric field E2 has a structure and a material different from those of the inter-gate insulating film 16 and has a dielectric constant lower than that of the inter-gate insulating film 16. For this reason, an increase in leakage current generated in the inter-gate insulating film and dielectric breakdown of the inter-gate insulating film are not generated.

In the embodiment, the area adjacent to the end portion of the inter-gate insulating film 16 in a direction of channel length is filled with the side-wall insulating film 19. Alternatively, however, the area may be comprised of a void.

The source/drain diffusion layer 12 and the extension diffusion layer 13 may not be formed in the semiconductor substrate 11 but in a well region or an epitaxial semiconductor layer.

According to the device structure of the example of the present invention, an insulating film which is present on a path of the edge electric field E2 is not the inter-gate insulating film 16 but the side-wall insulating film 19 (or void). Only a planar electric field E1 is applied to the inter-gate insulating film 16.

Since a dielectric constant of the side-wall insulating film 19 (or void) is lower than a dielectric constant of the inter-gate insulating film (for example, an ONO, a high dielectric constant material, or the like) 16, an electric film thickness of an edge portion is larger than an electric film thickness of the inter-gate insulating film 16, and a decrease in leakage current generated in the inter-gate insulating film and prevention of dielectric breakdown of the inter-gate insulating film can be realized.

Figure 2:
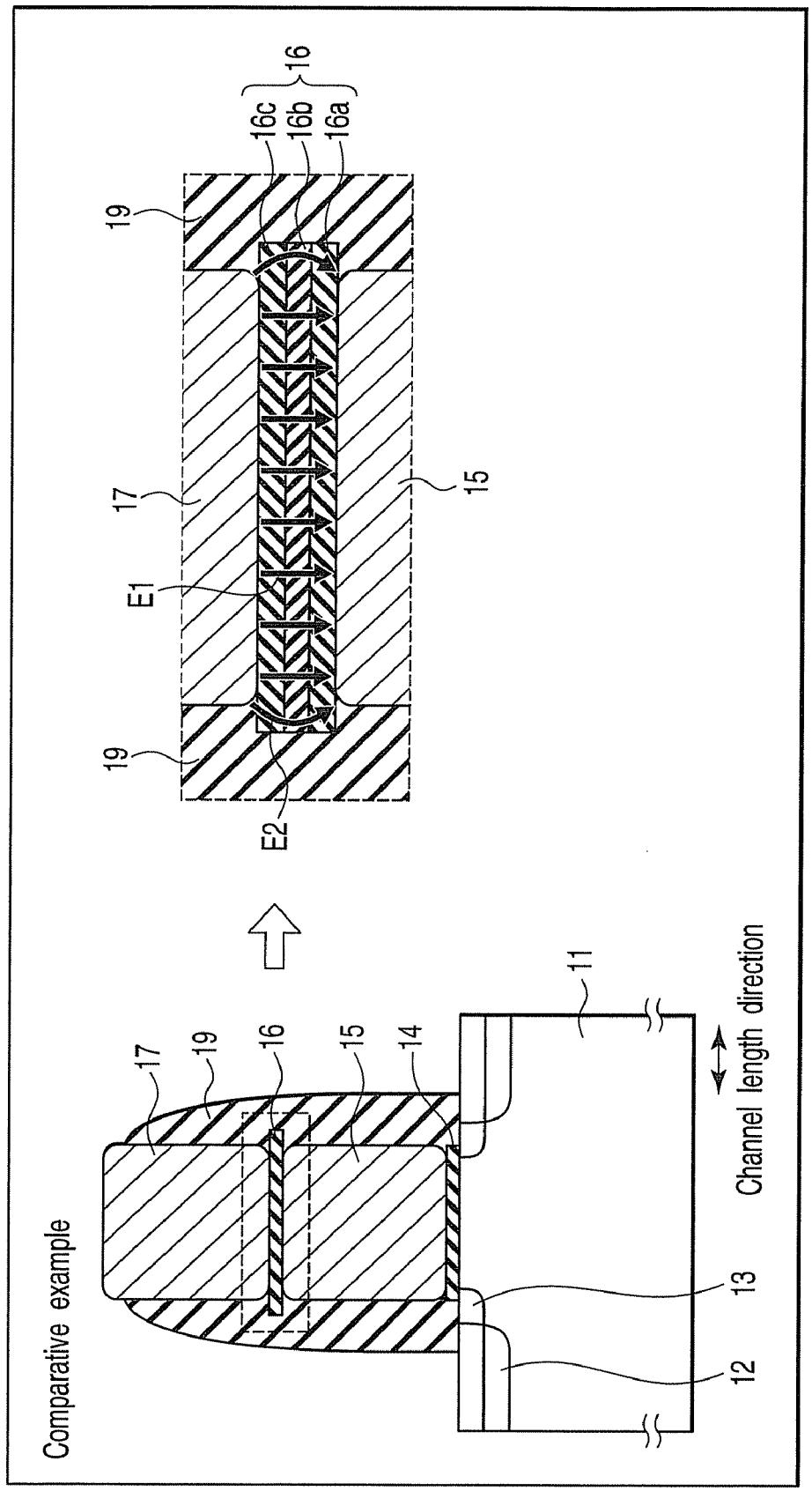
FIG. 2 is a sectional view showing a device structure according to a comparative example.

FIG. 2 shows a device structure of a memory cell serving as a comparative example.

This structure is different from the structure shown in FIG. 1 in that the inter-gate insulating film 16 projects outward from the side surface of the floating gate electrode 15 or the side surface of the control gate electrode 17.

The projection of the inter-gate insulating film 16 expresses all conventional memory cells.

More specifically, the structure in FIG. 2 includes a conventional memory cell in which an end portion of an inter-gate insulating film in a direction of channel length is matched with a side surface of a floating gate electrode or a side surface of a control gate electrode.

This is because most of the references which disclose conventional memory cells omit oxidizing steps performed immediately after the floating gate electrode and the control gate electrode are patterned.

However, in fact, the oxidizing steps are executed in all the conventional memory cells. More specifically, in the conventional memory cell, the side surface of the floating gate electrode and the side surface of the control gate electrode are substantially eroded internally by the oxidizing steps. As a result, the inter-gate insulating film projects outward from the side surface of the floating gate electrode or the side surface of the control gate electrode.

In this case, an insulating film present on a path of the edge electric field E2 is the inter-gate insulating film 16. Since the edge electric field E2 is larger than the planar electric field E1, an increase in leakage current generated in the inter-gate insulating film and dielectric breakdown of the inter-gate insulating film are generated disadvantageously.

(2) Consideration of Amount of Erosion of Inter-Gate Insulating Film

An amount of erosion of an inter-gate insulating film to obtain an effect of the example of the present invention without deteriorating other parameters related to writing/erasing characteristics will be considered.

In this case, it is assumed that the amount of erosion of the inter-gate insulating film is a distance from an end portion of the inter-gate insulating film in a direction of channel length in a final shape of a memory cell to a floating gate electrode or a control gate electrode.

More specifically, the amount of erosion of the inter-gate insulating film is determined in the final shape of the memory cell processed in an etching step of the inter-gate insulating film and oxidizing steps of the floating gate electrode and the control gate electrode.

Furthermore, the amount of erosion of the inter-gate insulating film means an amount of erosion of the highest dielectric constant material when the inter-gate insulating film is comprised of a stack structure of a plurality of insulating materials.

Figure 3:
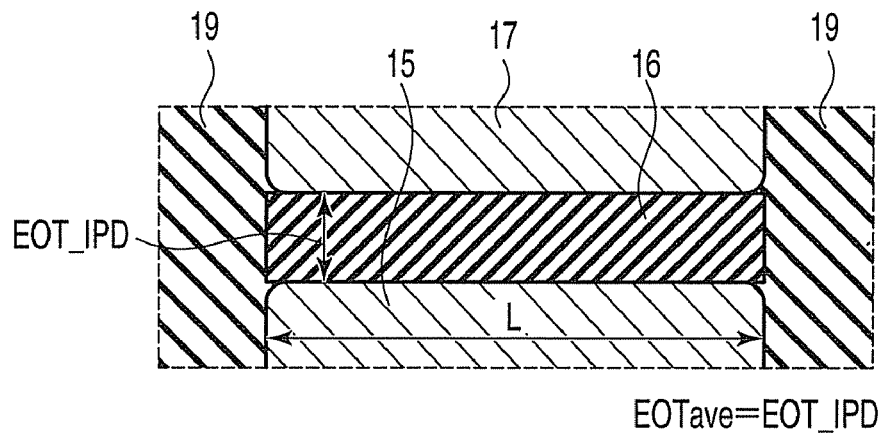
FIG. 3 is a diagram showing a lower limit of an amount of erosion of an inter-gate insulating film.

As shown in FIG. 3, a lower limit of the amount of erosion of the inter-gate insulating film 16 is obtained in a state in which the end portion of the inter-gate insulating film 16 in a direction of channel length is matched with the side surface of the floating gate electrode 15 or the side surface of the control gate electrode 17 after the oxidizing step.

The structure is realized in such a manner that the end portion of the inter-gate insulating film 16 in a direction of channel length is etched in an etching step by an amount equal to the amount of erosion of the side surface of the floating gate electrode 15 or the side surface of the control gate electrode 17 by the oxidizing step.

For example, if the side surface of the floating gate electrode 15 or the side surface of the control gate electrode 17 is eroded by the oxidizing step by about 3 nm, an amount of etching of the end portion of the inter-gate insulating film 16 in the direction of channel length in the etching step is also set at about 3 nm.

In this manner, the final shape of the memory cell is obtained in a state in which the end portion of the inter-gate insulating film 16 in the direction of channel length is matched with the side surface of the floating gate electrode 15 or the side surface of the control gate electrode 17.

Figure 4:
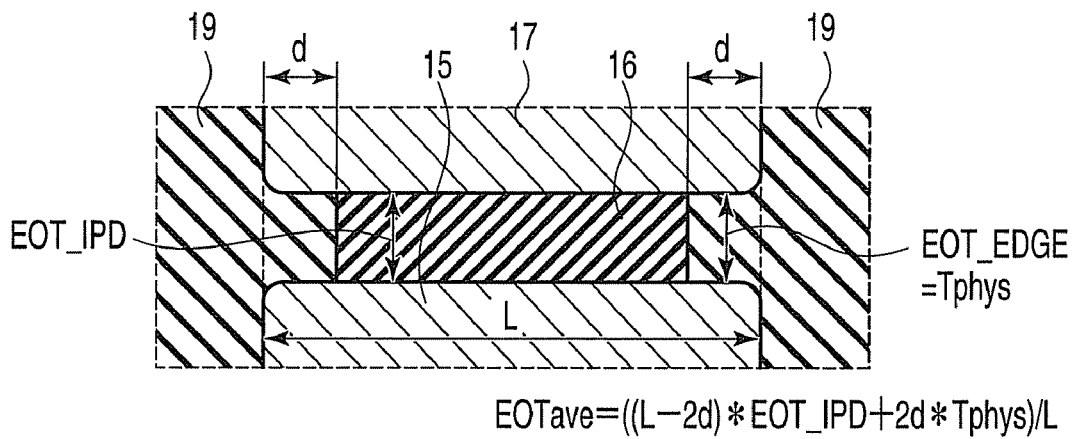
FIG. 4 is a diagram showing an upper limit of an amount of erosion of the inter-gate insulating film.

As shown in FIG. 4, an upper limit dmax [nm] of an amount of erosion of the inter-gate insulating film 16 is given by the following equation:

$$d\max = (1/2) EOT\_tol \times L/(Tphys - EOT\_IPD) [\text{nm}]$$

where EOT_tol is an allowable value of a fluctuation of EOT, L is a width [nm] of the floating gate electrode 15 or the control gate electrode 17 in the direction of channel length, EOT_IPD is EOT [nm] of the inter-gate insulating film 16, and EOT_EDGE (=Tphys) is EOT [nm] of a material in an area (to be referred to as an edge area) extending from the end portion of the inter-gate insulating film 16 to the side surface of the floating gate electrode 15 or the side surface of the control gate electrode 17.

The reason why the upper limit dmax of the amount of erosion of the inter-gate insulating film 16 is set will be described.

According to the device structure of the embodiment of the present invention, the inter-gate insulating film 16 occupies most of the area between the floating gate electrode 15 and the control gate electrode 17.

However, when the amount of erosion of the inter-gate insulating film 16 increases, in the edge area of the area between the floating gate electrode 15 and the control gate electrode 17, for example, the side-wall insulating film 19 having a dielectric constant lower than that of the inter-gate insulating film 16 is filled.

For this reason, when the edge area increases, a coupling ratio naturally decreases.

Therefore, the upper limit of the amount of erosion of the inter-gate insulating film 16 is the maximum allowable value of the decrease in coupling ratio by erosion of the inter-gate insulating film 16.

The maximum allowable value will be calculated.

A decrease in the coupling ratio can be understood as an increase in electric film thickness in the edge area.

In this case, the electric film thickness is defined as a converted film thickness of a silicon oxide required to realize the same capacitance when the insulating film (inter-gate insulating film or side-wall insulating film) or a void is replaced with silicon oxide.

The electric film thickness corresponds to an EOT (equivalent oxide thickness).

More specifically, the coupling ratio CR is expressed by the following equations:

$$CR = C\_IPD/(C\_\text{tunnel} + C\_IPD)$$

$$C\_IPD = \in \times S/EOT$$

where $\in$ is a dielectric constant of silicon oxide, S is an area in which the floating gate electrode 15 and the control gate electrode 17 face each other, and EOT is an EOT of an insulating film between the floating gate electrode 15 and the control gate electrode 17.

Since the values $\in$ and S are constant independently of the amount of erosion of the inter-gate insulating film 16, C_IPD depends on EOT. Therefore, a decrease in the coupling ratio CR can be understood as an increase in EOT in the edge area.

As described above, as optimization of the memory cell structure, various parameters are optimized. With micropatterning of a memory cell, allowable margins of fluctuations of parameters are very small.

Therefore, the increase in EOT in the edge area is desirably minimized.

Therefore, in this case, the maximum allowable value of the decrease in coupling ratio (increase in EOT in the edge area) is set to be the allowable value or less of the fluctuation of processes, i.e., an allowable value or less of the fluctuation of the EOT in a film forming process of the inter-gate insulating film 16.

When the allowable value of the fluctuation of the EOT is set at EOT_tol [nm], the maximum allowable value of the increase in EOT in the edge area becomes EOT_tol.

In the state in which the end portion of the inter-gate insulating film 16 in the direction of channel length is matched with the side surface of the floating gate electrode 15 or the side surface of the control gate electrode 17, as shown in FIG. 3, an EOT (=EOTave) [nm] of the insulating film between the floating gate electrode 15 and the control gate electrode 17 is given by the following equation:

$$EOT\text{ave} = EOT\_IPD \qquad (1)$$

where EOT_IPD is an EOT [nm] of the inter-gate insulating film 16.

In contrast to this, in the state in which the end portion of the inter-gate insulating film 16 in the direction of channel length is on the inward side of the side surface of the floating gate electrode 15 or the side surface of the control gate electrode 17, as shown in FIG. 4, an EOT (=EOTave) [nm] of the insulating film between the floating gate electrode 15 and the control gate electrode 17 is given by the following equation:

$$EOTave = ((L-2d) \times EOT\_IPD + 2d \times Tphys)/L \qquad (2)$$

where, L is a width [nm] of the floating gate electrode 15 or the control gate electrode 17 in the direction of channel length, and d is a distance [nm] from the end portion of the inter-gate insulating film 16 in the direction of channel length to the side surface of the floating gate electrode 15 or the side surface of the control gate electrode 17.

Reference symbol EOT_IPD denotes an EOT [nm] of the inter-gate insulating film 16, and reference symbol EOT_EDGE (=Tphys) is an EOT [nm] of the insulating film in the edge area.

A difference between equation (1) and equation (2) must be equal to or smaller than the maximum allowable value EOT_tol, the following expression is given:

$$[(L-2d) \times EOT\_IPD + 2d \times Tphys)/L] - EOT\_IPD \leq EOT\_tol \qquad (3)$$

When the upper limit dmax [nm] of the amount of erosion of the inter-gate insulating film 16 is calculated from equation (3), the following expression is given:

$$d \leq dmax = (\tfrac{1}{2}) EOT\_tol \times L/(Thpys - EOT\_IPD) \, [nm]$$

For example, when EOT_tol=0.5 nm, L=100 nm, Tphys=15 nm, and EOT_IPD=10 nm are given, the upper limit dmax of the amount of erosion of the inter-gate insulating film 16 is given by the following equation:

$$dmax = 0.25 \times 100/(15-10) \, [nm]$$
$$= 5 \, nm$$

Finally, an amount of etching of the inter-gate insulating film 16 is a sum of the amount of erosion of the side surface of the floating gate electrode 15 or the side surface of the control gate electrode 17 in the oxidizing step and the amount of erosion of the inter-gate insulating film 16.

Therefore, when the amount of erosion of the side surface of the floating gate electrode 15 or the side surface of the control gate electrode 17 in the oxidizing step is estimated as 3 nm, a maximum value ETCHmax [nm] of an amount of etching of the inter-gate insulating film 16 is given by:

$$ETCHmax = dmax + 3 \, nm = (\tfrac{1}{2}) EOT\_tol \times L/(Tphys - EOT\_IPD) + 3 \, nm$$

As described above, a range of the amount of etching of the inter-gate insulating film in the example of the present invention may be expressed by:

$$3 \, nm \leq amount \, of \, etching \leq (\tfrac{1}{2}) EOT\_tol \times L/(Tphys - EOT\_IPD) + 3 \, nm$$

The upper limit of the amount of erosion of the inter-gate insulating film 16 may be regulated by a rate of a decrease in coupling ratio.

For example, it is assumed that the decrease in coupling ratio is required to be suppressed to 5% or less in terms of matching with another process. In this case, when a coupling ratio obtained by the structure in FIG. 3 is represented by CR_1, and a coupling ratio obtained by the structure in FIG. 4 is represented by CR_2, an amount of erosion (amount of etching) of the inter-gate insulating film 16 is determined so as to satisfy the following expression:

$$CR\_2/CR\_1 \geq 0.95$$

(3) Consequence

In this manner, according to the embodiment of the present invention, the end portion of the inter-gate insulating film in the direction of channel length is matched with the side surface of the floating gate electrode or the side surface of the control gate electrode, or is on the inward side of the side surface.

As described above, only the structure of the inter-gate insulating film is changed without changing the entire structure of the memory cell, so that the coupling ratio can be increased without an increase in leakage current generated in the inter-gate insulating film and dielectric breakdown of the inter-gate insulating film.

In addition, according to the cell structure of the embodiment of the present invention, inter-cell interference can be reduced in comparison with the case using a columnar floating gate electrode. For this reason, the cell structure is advantageous to micropatterning of a memory cell.

4. Application

The example of the present invention may be applied to nonvolatile semiconductor memories having memory cells of stack gate structures in general.

In this case, the nonvolatile semiconductor memories include, in addition to general memories such as a NAND flash memory and a NOR flash memory, a nonvolatile semiconductor memory combinationally mounted on a logic LSI, for example, a 2-Tr-type flash memory, a 3-Tr-type flash memory, and the like.

A case in which the example of the present invention is applied to a NAND flash memory which is a typical example of a nonvolatile memory will be described below.

(1) Overall Diagram

Figure 5:
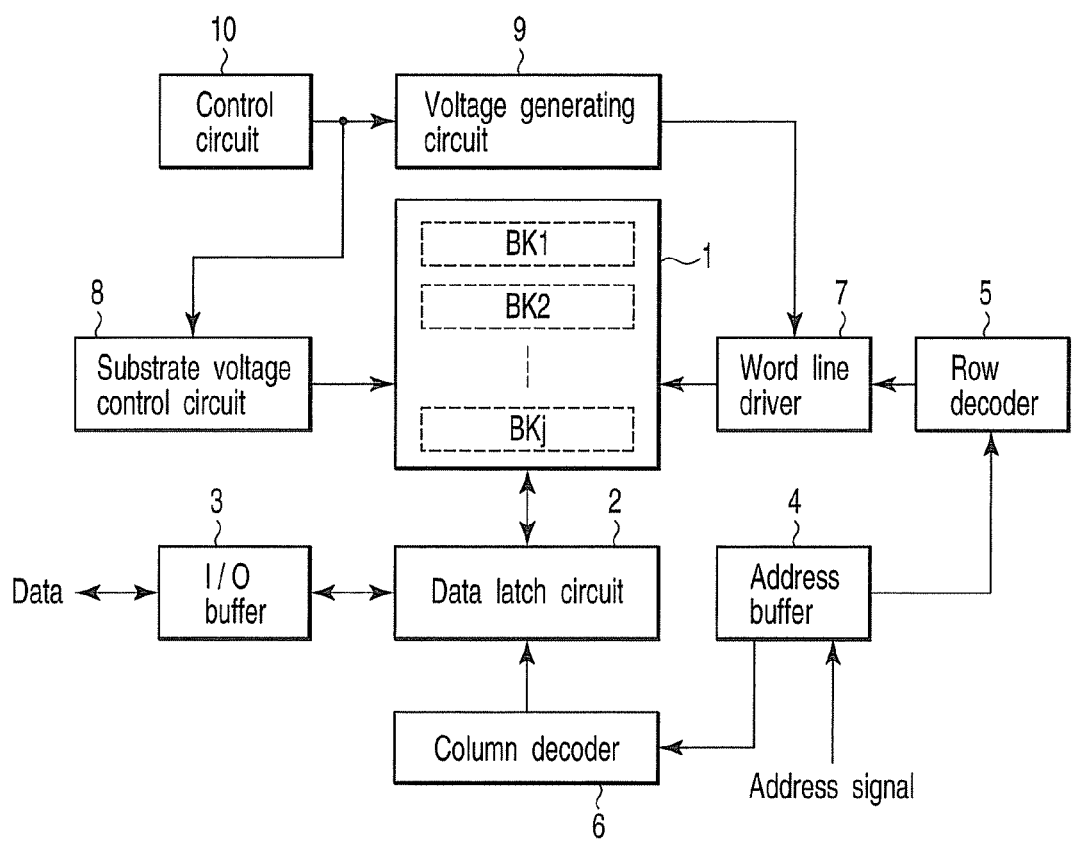
FIG. 5 is an overall diagram of a NAND flash memory.

FIG. 5 is an overall diagram of a NAND flash memory.

A memory cell array 1 is comprised of a plurality of blocks BK1, BK2, ..., BLj. Each of the blocks BK1, BK2, ..., BLj has a plurality of cell units. Each of the plurality of cell units is comprised of a NAND string comprised of a plurality of memory cells connected in series with each other and two select gate transistors which are connected to both the ends of the NAND string, respectively.

A data latch circuit 2 has a function of temporarily latching data in a read/write state, and is comprised of, for example, a flip flop circuit. An I/O (input/output) buffer 3 functions as an interface circuit for data, and an address buffer 4 functions as an interface circuit for an address signal.

A row decoder 5 and a column decoder 6 select a memory cell in the memory cell array 1 on the basis of an address signal. A word line driver 7 drives a selected word line in the selected block.

A substrate voltage control circuit 8 controls a voltage of a semiconductor substrate. More specifically, when a double well region comprised of an n-type well region and a p-type well region is formed in a p-type semiconductor substrate, and the memory cell is formed in the p-type well region, a voltage of the p-type well region is controlled depending on an operation mode.

For example, the substrate voltage control circuit 8 sets the p-type well region at 0V at the time of read/write and sets the p-type well region at a voltage of 15V or more and 40V or less at the time of erase.

A voltage generating circuit 9 generates a voltage to be given to a plurality of word lines in the selected block.

For example, in a read state, the voltage generating circuit 9 generates a read voltage and an intermediate voltage. The read voltage is given to the selected word line in the selected block, and the intermediate voltage is given to a non-selected word line in the selected block.

In the write state, the voltage generating circuit 9 generates a write voltage and an intermediate voltage. The write voltage is given to the selected word line in the selected block, and the intermediate voltage is given to the non-selected word line in the selected block.

A control circuit 10 controls operations of, for example, the substrate voltage control circuit 8 and the voltage generating circuit 9.

(2) Device Structure

Figure 6:
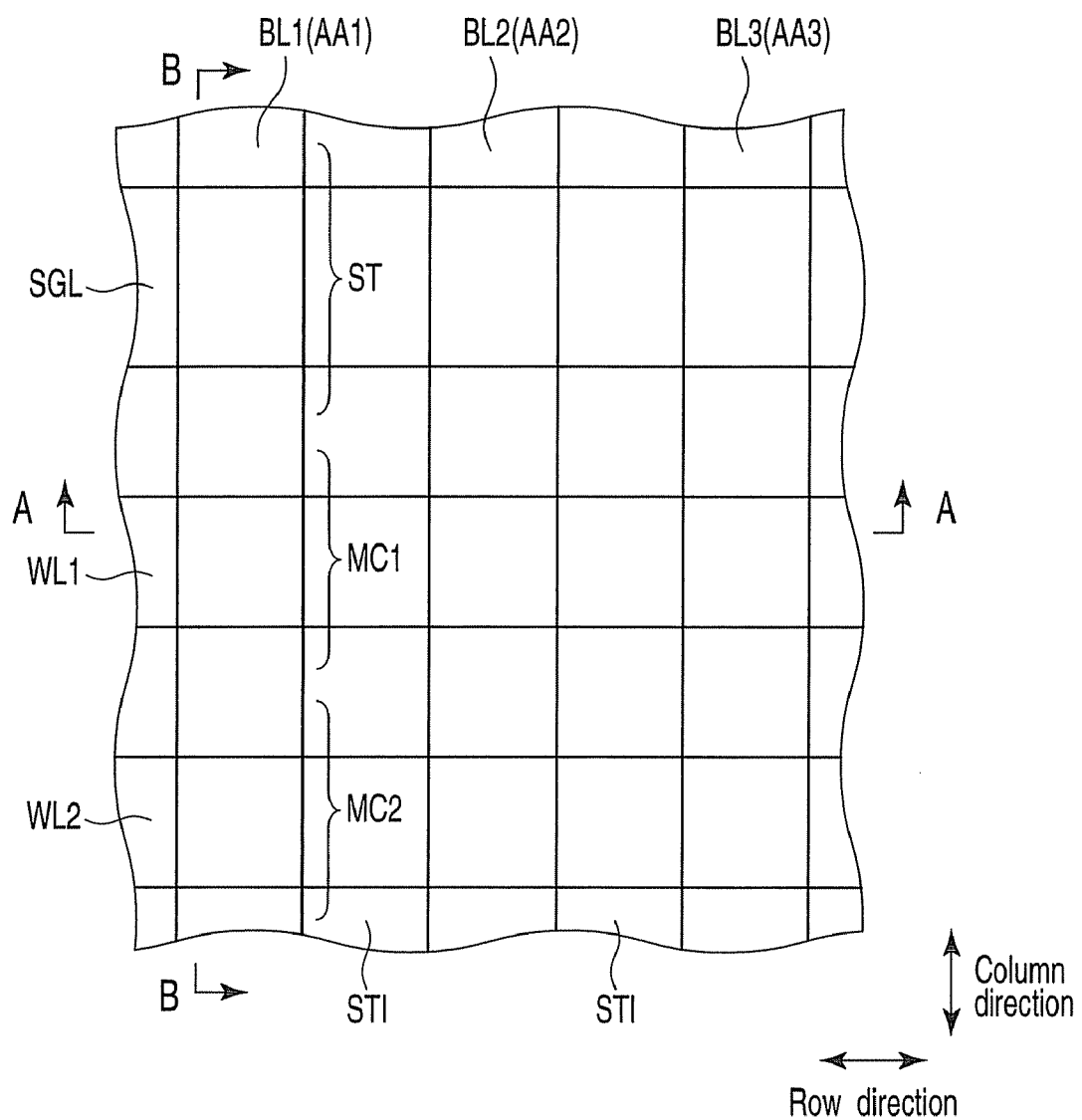
FIG. 6 is a plan view of a memory cell array.
Figure 7:
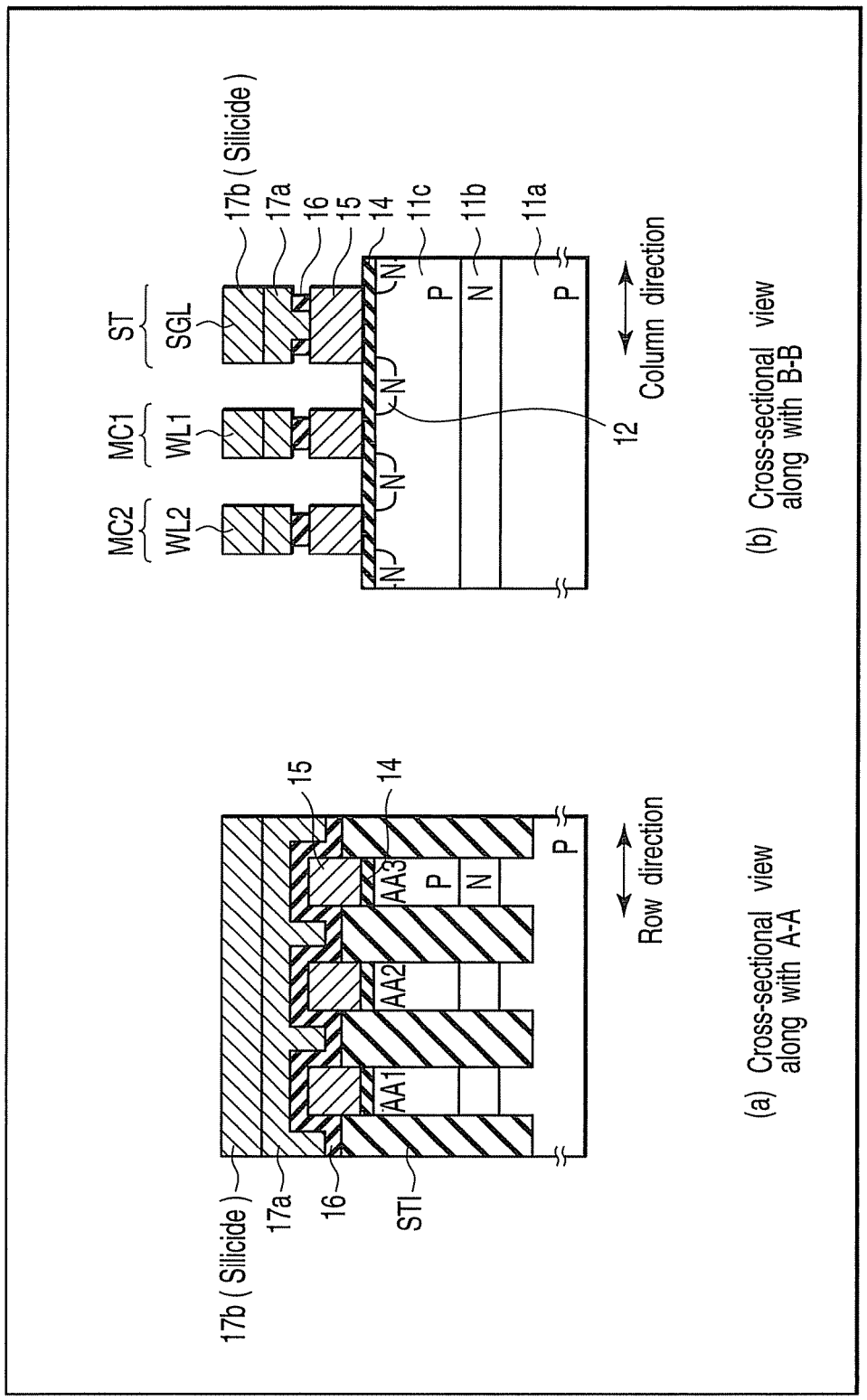
FIG. 7 is a diagram showing structures of a memory cell and a selection transistor.

FIG. 6 is a plan view of a memory cell array. FIG. 7 shows device structures of a memory cell and a selection transistor.

A sectional view in a row direction on the left side in FIG. 7 corresponds to a sectional view along an A-A line in FIG. 6, and a sectional view in a column direction on the right side corresponds to a sectional view along a B-B line in FIG. 6. However, a bit line is omitted.

In a p-type silicon substrate 11a, an element isolation insulating layer of an STI (Shallow Trench Isolation) structure is formed. In element regions (active areas) AA1, AA2, and AA3 surrounded by the element isolation insulating layer (STI), a double well region comprised of an n-type well region 11b and a p-type well region 11c is formed.

In the element region AA1, a NAND string comprised of a plurality of memory cells MC1, MC2, . . . , which are connected in series with each other and a NAND cell unit comprised of a selection transistor ST connected to one end of the NAND string are formed.

Each of the memory cells MC1, MC2, . . . has the source/drain diffusion layer 12 in the p-type well region 11c. On a channel region between the source/drain diffusion layers 12, a floating gate electrode (FG) 15 is formed through a gate insulating film 14.

On the floating gate electrode 15, control gate electrodes (WL1, WL2, . . . ) 17a and 17b serving as word lines are formed through the inter-gate insulating film 16. The control gate electrode 17a consists of conductive polysilicon, and the control gate electrode 17b consists of silicide.

The selection transistor ST, like a memory cell, has the source/drain diffusion layer 12 in the p-type well region 11c. On the channel region between the source/drain diffusion layers 12, a lower gate electrode 15 is formed through the gate insulating film 14.

On the lower gate electrode 15, upper gate electrodes (SGL) 17a and 17b serving as selection gate lines are formed through the inter-gate insulating film 16.

The inter-gate insulating film 16 of the selection transistor ST has an opening. The lower gate electrode 15 and the upper gate electrodes 17a and 17b are electrically connected through the opening. The upper gate electrode 17a consists of conductive polysilicon, and the upper gate electrode 17b consists of silicide.

End portions of the memory cells MC1, MC2, . . . in a direction of channel length of the inter-gate insulating film 16 (column direction) are on the inward side of the side surface of the floating gate electrode 15 or the side surfaces of the control gate electrodes 17a and 17b.

Similarly, for process reason, the end portion of the selection transistor ST in the direction of channel length of the inter-gate insulating film 16 is on the inward side of the side surface of the lower gate electrode 15 or the side surfaces of the upper gate electrodes 17a and 17b.

(3) Manufacturing Method

An example of a method of manufacturing a NAND cell unit in FIG. 7 will be described below.

Figure 8:
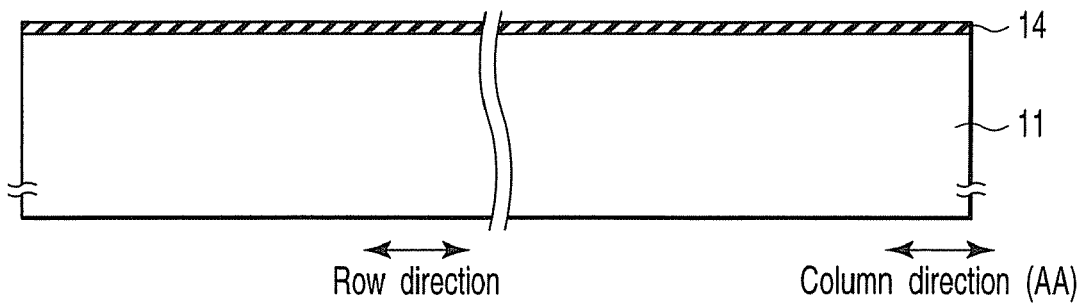
FIG. 8 is a sectional view showing one step of a manufacturing method.
Figure 9:
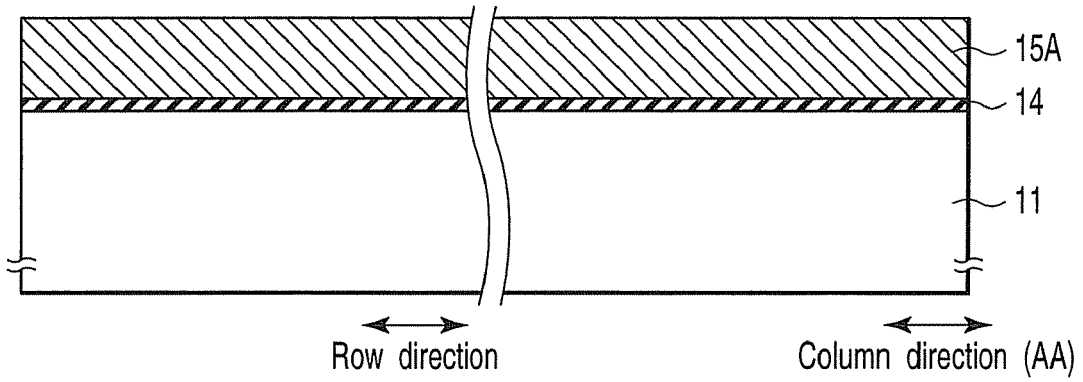
FIG. 9 is a sectional view showing one step of the manufacturing method.

As shown in FIG. 8, by a thermal oxidation method, the gate insulating film (tunnel oxide film) 14 is formed on the semiconductor substrate 11. Subsequently, as shown in FIG. 9, a conductive film (for example, conductive polysilicon containing an impurity) 15A is formed on the gate insulating film 14 by a CVD method.

Figure 10:
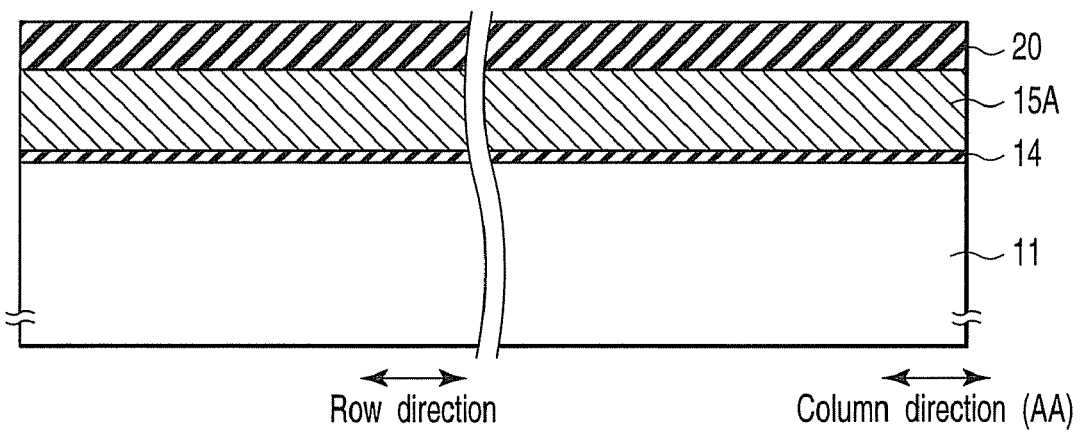
FIG. 10 is a sectional view showing one step of the manufacturing method.

As shown in FIG. 10, an insulating film (for example, silicon nitride) 20 is formed on the conductive film 15A by the CVD method.

Figure 11:
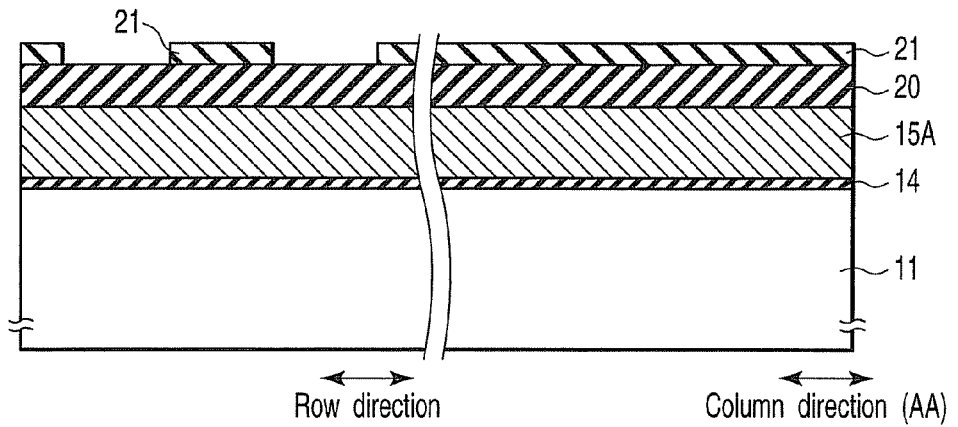
FIG. 11 is a sectional view showing one step of the manufacturing method.
Figure 12:
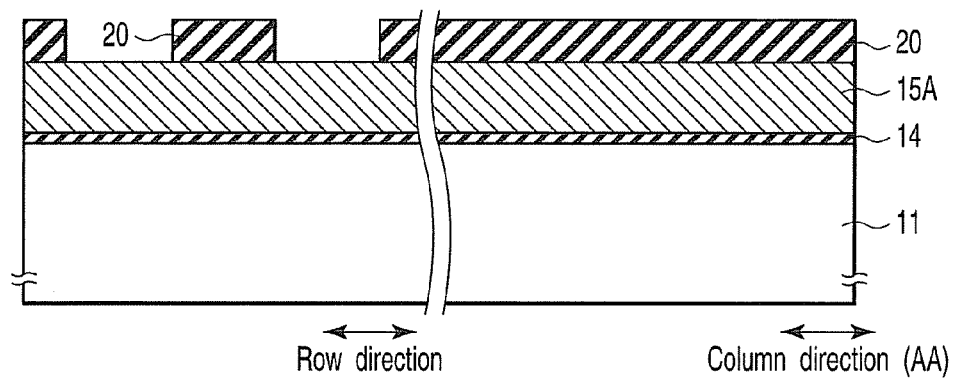
FIG. 12 is a sectional view showing one step of the manufacturing method.

As shown in FIG. 11, a resist pattern 21 is formed on the insulating film 20 by a PEP (Photo Engraving Process). When the insulating film 20 is etched by RIE using the resist pattern 21 as a mask, as shown in FIG. 12, a hard mask comprised of the insulating film 20 is formed.

Thereafter, the resist pattern 21 in FIG. 11 is removed.

Figure 13:
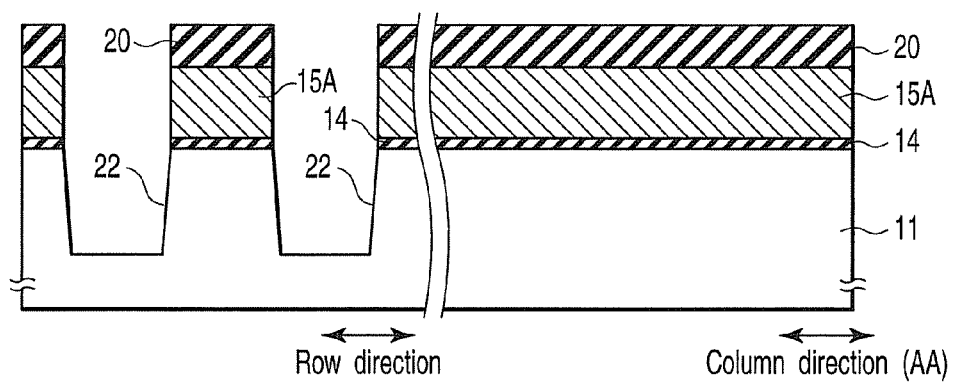
FIG. 13 is a sectional view showing one step of the manufacturing method.

As shown in FIG. 13, by using the insulating film 20 serving as the hard mask as a mask, the conductive film 15A, the gate insulating film 14, and the semiconductor substrate 11 are sequentially etched by RIE. As a result, a trench 22 is formed in these members.

Figure 14:
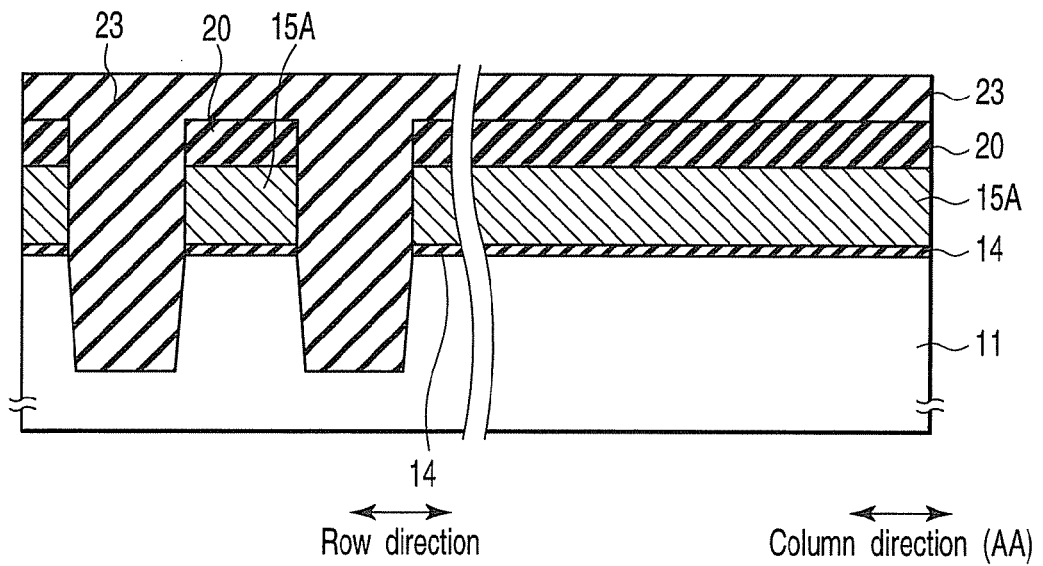
FIG. 14 is a sectional view showing one step of the manufacturing method.
Figure 15:
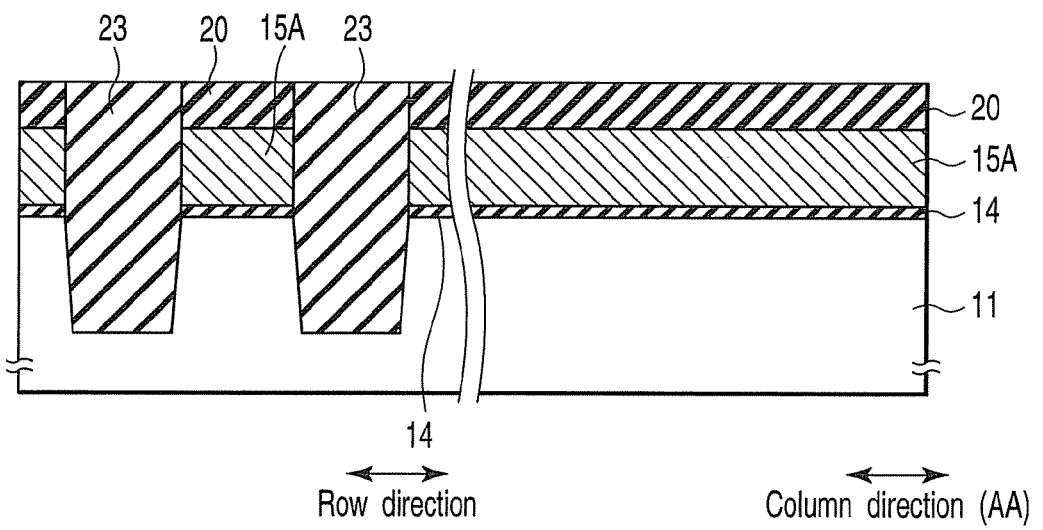
FIG. 15 is a sectional view showing one step of the manufacturing method.

As shown in FIG. 14, an insulating film (for example, silicon oxide) 23 which completely fills the trench 22 is formed on the insulating film 20 by the CVD method. As shown in FIG. 15, the insulating film 23 is polished by a CMP (Chemical Mechanical Polishing) method until the upper surface of the insulating film 23 is almost flush with the upper surface of the insulating film 20.

Figure 16:
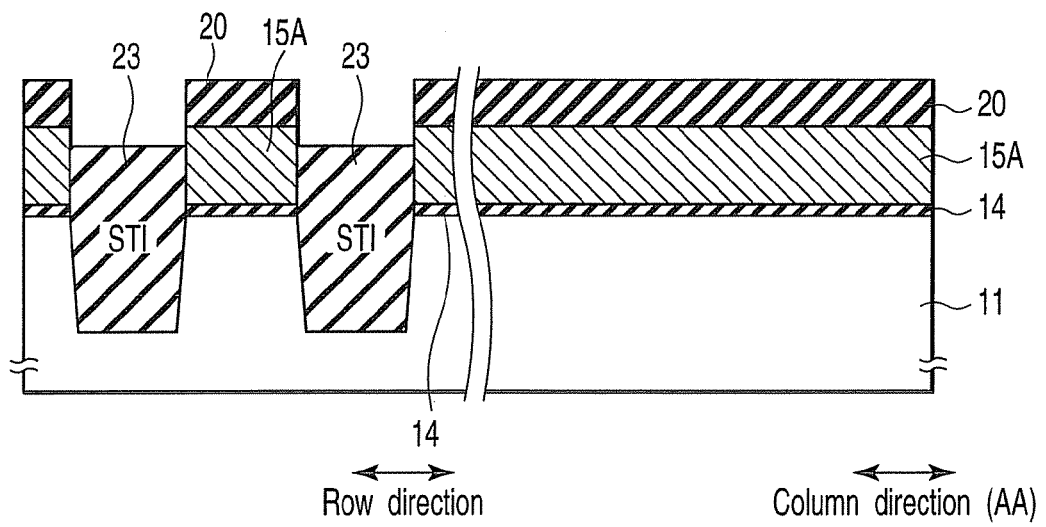
FIG. 16 is a sectional view showing one step of the manufacturing method.

Subsequently, as shown in FIG. 16, the insulating film 23 is selectively etched to adjust a position of the upper surface of the insulating film 23. In this example, an amount of etching is controlled such that the upper surface of the insulating film 23 is located between an upper surface and a lower surface of the conductive film 15A. As a result, STI (Shallow Trench Isolation) serving as an element isolation insulating layer is completed.

Thereafter, the insulating film 20 in FIG. 16 is removed.

Figure 17:
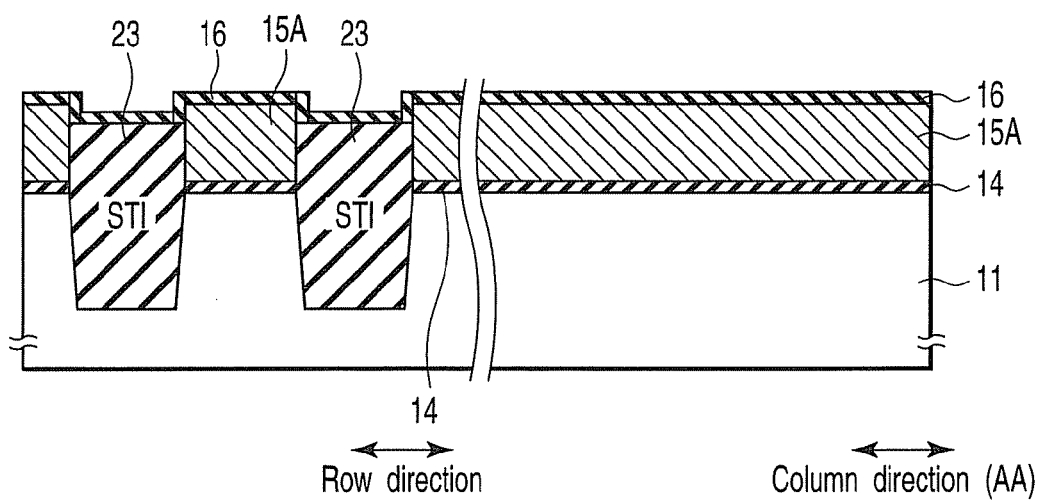
FIG. 17 is a sectional view showing one step of the manufacturing method.
Figure 18:
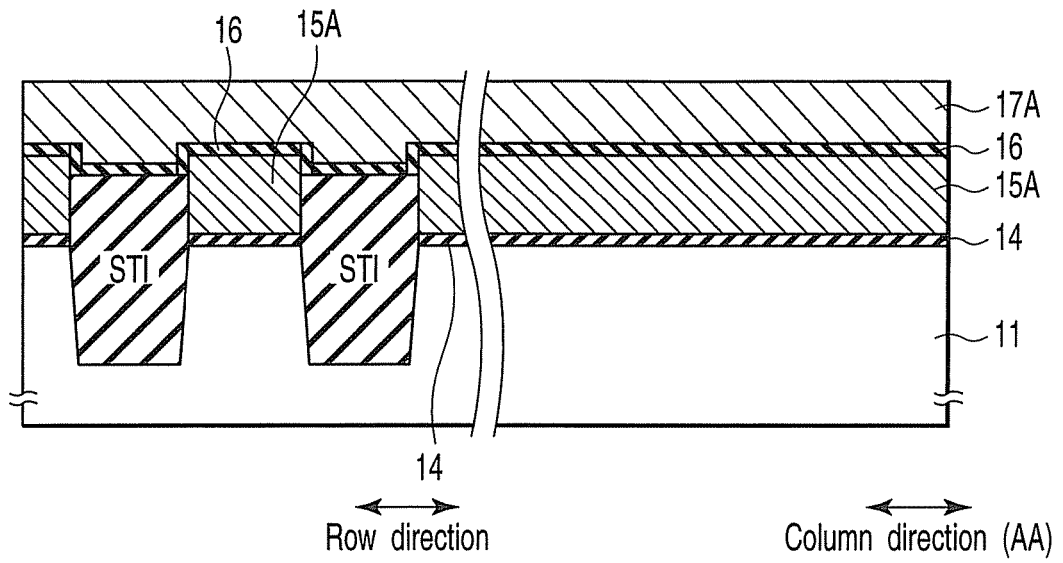
FIG. 18 is a sectional view showing one step of the manufacturing method.

As shown in FIG. 17, the inter-gate insulating film (for example, ONO, a high dielectric constant material, and the like) 16 covering the entire upper surface of the conductive film 15A and a part of the side surface of the conductive film 15A is formed by the CVD method. Subsequently, as show in FIG. 18, a conductive film (for example, conductive polysilicon containing an impurity) 17A is formed on the inter-gate insulating film 16 by the CVD method.

About the conductive film 17A, it may be formed after removing a part of the inter-gate insulating film 16 located at an area in which a selection transistor will be formed. In this case, a gate electrode of the selection transistor is comprised of the conductive films 15A, 17A electrically connected each other.

Figure 19:
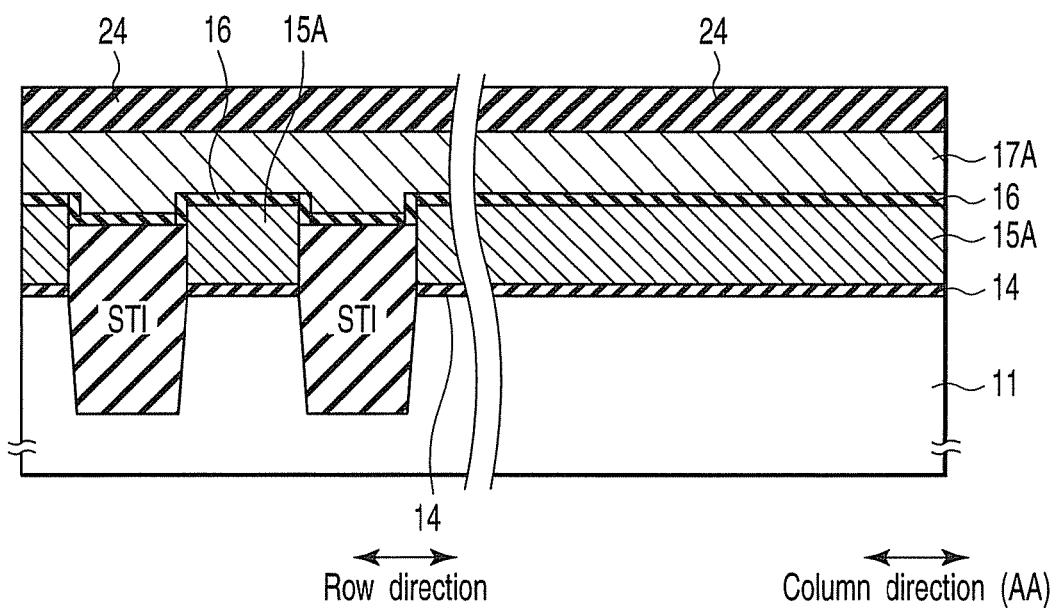
FIG. 19 is a sectional view showing one step of the manufacturing method.

As shown in FIG. 19, an insulating film (for example, silicon nitride) 24 is formed on the conductive film 17A by the CVD method.

Figure 20:
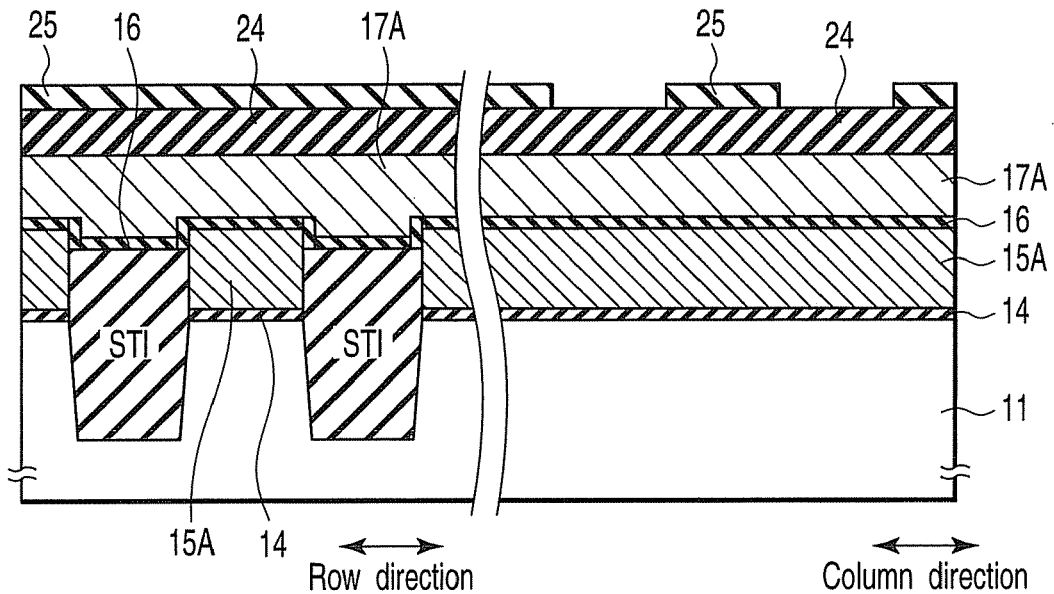
FIG. 20 is a sectional view showing one step of the manufacturing method.

As shown in FIG. 20, a resist pattern 25 is formed on the insulating film 24 by PEP. When the insulating film 24 is etched by RIE using the resist pattern 25 as a mask, as shown in FIG. 21, a hard mask comprised of the insulating film 24 is formed.

Thereafter, the resist pattern 25 in FIG. 20 is removed.

Figure 21:
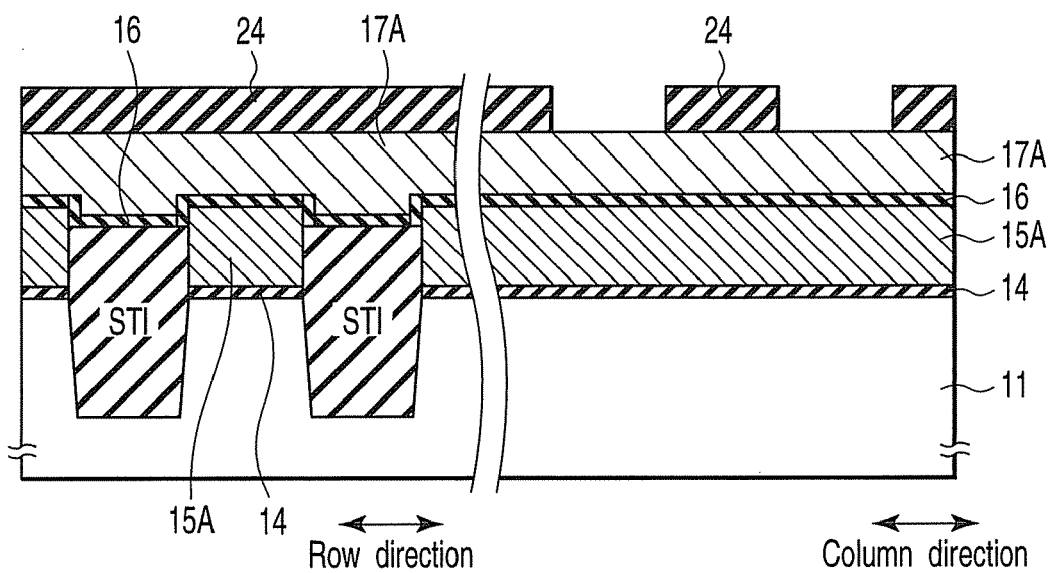
FIG. 21 is a sectional view showing one step of the manufacturing method.

As shown in FIG. 21, the conductive film 17A, the inter-gate insulating film 16, the conductive film 15A, and the gate insulating film 14 are sequentially etched by RIE using the insulating film 24 serving as the hard mask as a mask.

Figure 22:
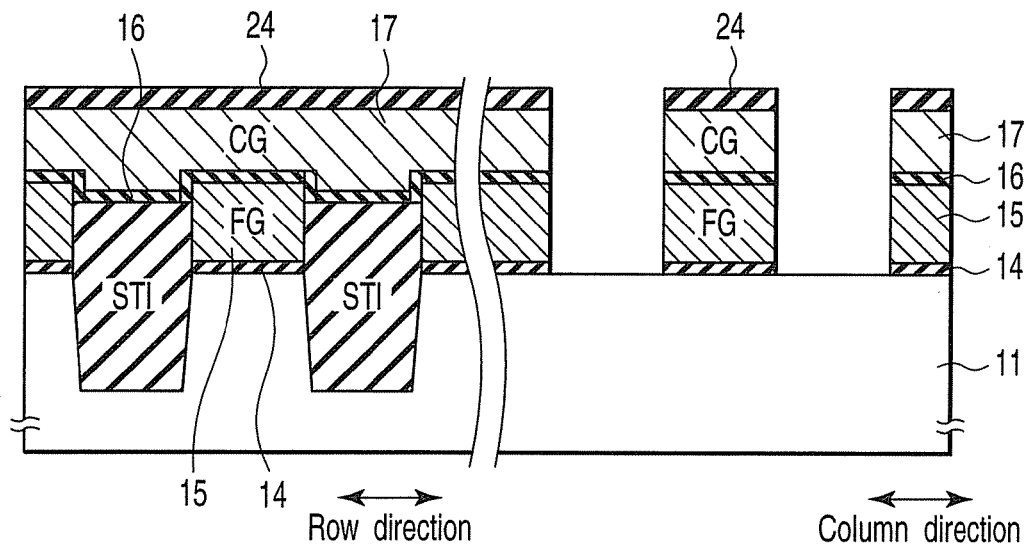
FIG. 22 is a sectional view showing one step of the manufacturing method.

As a result, as shown in FIG. 22, the floating gate electrode (FG) 15 and the control gate electrode (CG) 17 are formed.

At this time, the end portion of the inter-gate insulating film 16 in the direction of channel length (column direction) is matched with the side surface of the floating gate electrode (FG) 15 and the side surface of the control gate electrode (CG) 17.

Figure 23:
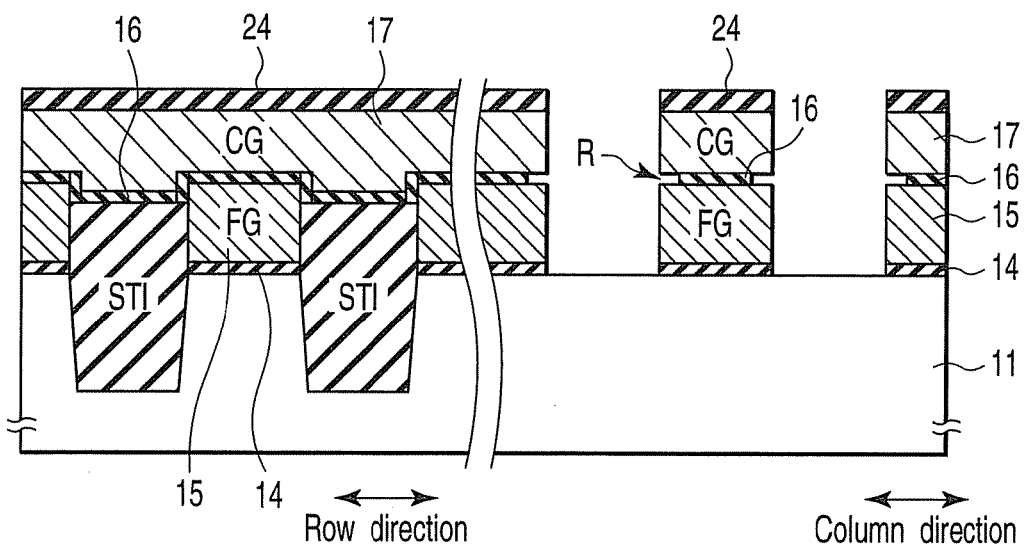
FIG. 23 is a sectional view showing one step of the manufacturing method.

Thereafter, as shown in FIG. 23, the end portion of the inter-gate insulating film 16 in the direction of channel length is etched.

An amount of etching, as described in the item "Consideration of Amount of Erosion of Inter-gate Insulating Film", falls in a range given by 3 nm≦amount of etching≦(½) EOT_tol×L/(Tphys−EOT_IPD)+3 nm. Since the meanings of the symbols have been explained in the item "Consideration of Amount of Erosion of Inter-gate Insulating Film", a description thereof will be omitted.

As a result, in an area adjacent to the end portion of the inter-gate insulating film 16 in the direction of channel length, a depression (edge area) R is formed.

In this case, etching for the inter-gate insulating film 16 is performed to the gate insulating film 14, the floating gate electrode (FG) 15, and the control gate electrode (CG) 17 by using chemical liquid having an etching selectivity such that only the inter-gate insulating film 16 is selectively etched.

For example, it is assumed that the gate insulating film 14 consists of silicon oxide, that the floating gate electrode (FG) 15 and the control gate electrode (CG) 17 consist of polysilicon, and that the inter-gate insulating film 16 consists of ONO. In this case, chemical liquid (for example, hot phosphoric acid) is used such that an etching rate of silicon nitride constituting ONO is sufficiently higher than etching rates of silicon oxide and polysilicon.

At this time, only the silicon nitride of the ONO is etched. However, as will be described below, when silicon oxide is filled in the depression R, only the inter-gate insulating film 16 is consequently eroded.

It is assumed that the gate insulating film 14 consists of silicon oxide, that the floating gate electrode (FG) 15 and the control gate electrode (CG) 17 consist of polysilicon, and that the inter-gate insulating film 16 consists of a high dielectric constant material (for example, metal oxide). In this case, chemical liquid (for example, SPM (mixture of sulfuric acid and hydrogen peroxide solution) is used such that the high dielectric constant material may be selectively etched.

The etching of edge portion in the channel length direction of the inter-gate insulating film 16 is also performed about that of the selection transistor. The etching of edge portion in the channel length direction of the inter-gate insulating film 16 of the selection transistor is completely with no problem. Because the conductive films 15A, 17A of the selection transistor are electrically connected each other. Therefore, a mask which covers the selection transistor is unnecessary, and a process for manufacturing a device of the preset invention becomes simple.

As shown in FIG. 24, an impurity is injected into the semiconductor substrate 11 in a self-alignment manner by an ion injection method using the floating gate electrode (FG) 15 and the control gate electrode (CG) 17 as masks to form an extension diffusion layer 13.

An oxidizing step is executed to perform recovery from a damage caused by the etching step and the ion injection step.

By the oxidizing step, an oxide film (for example, silicon oxide) 18 is formed on the side surface of the floating gate electrode (FG) 15 and the side surface of the control gate electrode (CG) 17.

At this time, the side surface of the floating gate electrode (FG) 15 and the side surface of the control gate electrode (CG) 17 are eroded to the inward side.

However, since the amount of etching of the inter-gate insulating film 16 is controlled as descried above, even after the oxidizing step, the end portion of the inter-gate insulating film 16 in the direction of channel length is on the inward side of the side surface of the floating gate electrode (FG) 15 or the side surface of the control gate electrode (CG) 17.

As shown in FIG. 25, an insulating film (for example HTO (high temperature oxide)) 19A covering the floating gate electrode (FG) 15 and the control gate electrode (CG) 17 is formed. At this time, the insulating film 19A fills the depression R adjacent to the end portion of the inter-gate insulating film 16 in the direction of channel length.

Figure 26:
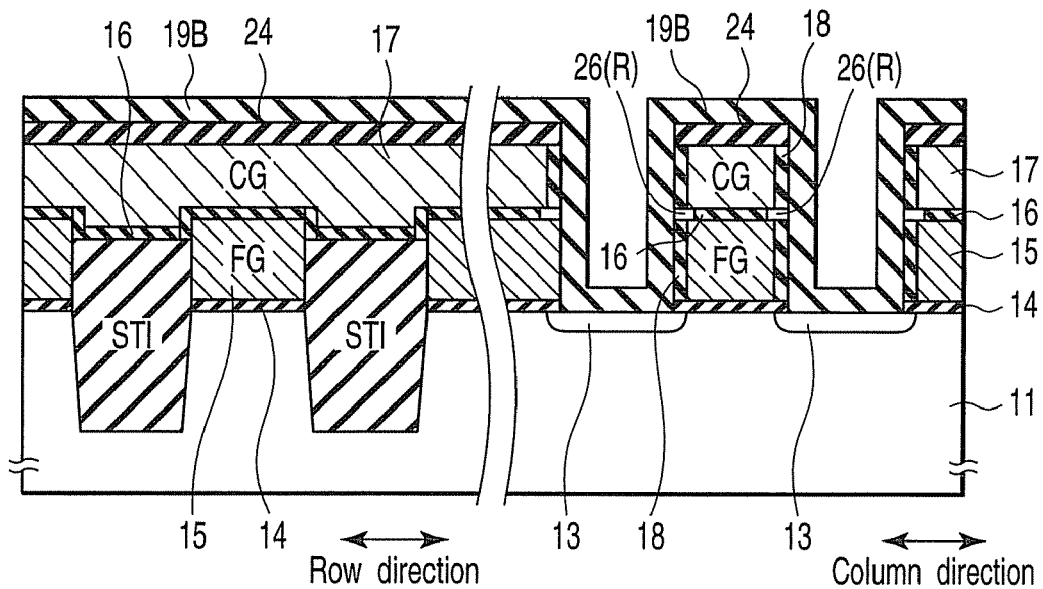
FIG. 26 is a sectional view showing one step of the manufacturing method.

In place of FIG. 25, as shown in FIG. 26, a void 26 may be used as the depression R adjacent to the end portion of the inter-gate insulating film 16 in the direction of channel length.

It is controlled whether the depression R is filled or void is formed, in accordance with coverage property (depending on a material of an insulating film, a film forming method, or the like) of the insulating film covering the floating gate electrode and the control gate electrode.

For example, since an ALD (atomic layer deposition) method may theoretically realize 100% coverage property, as shown in FIG. 25, the ALD method is suitably used to fill the depression R with the insulating film 19A.

When an LPCVD method is used, depending on an aspect ratio of the depression R (amount of erosion of the inter-gate insulating film (depth of depression)/amount of erosion and width between the floating gate electrode and the control gate electrode), the depression R may be filled with the insulating film 19A as shown in FIG. 25, or the void 26 may be used as the depression R as shown in FIG. 26.

Furthermore, since the plasma CVD method is known as a film forming method having poor coverage property, when the method is used, the void 26 as shown in FIG. 26 may be easily formed.

Figure 27:
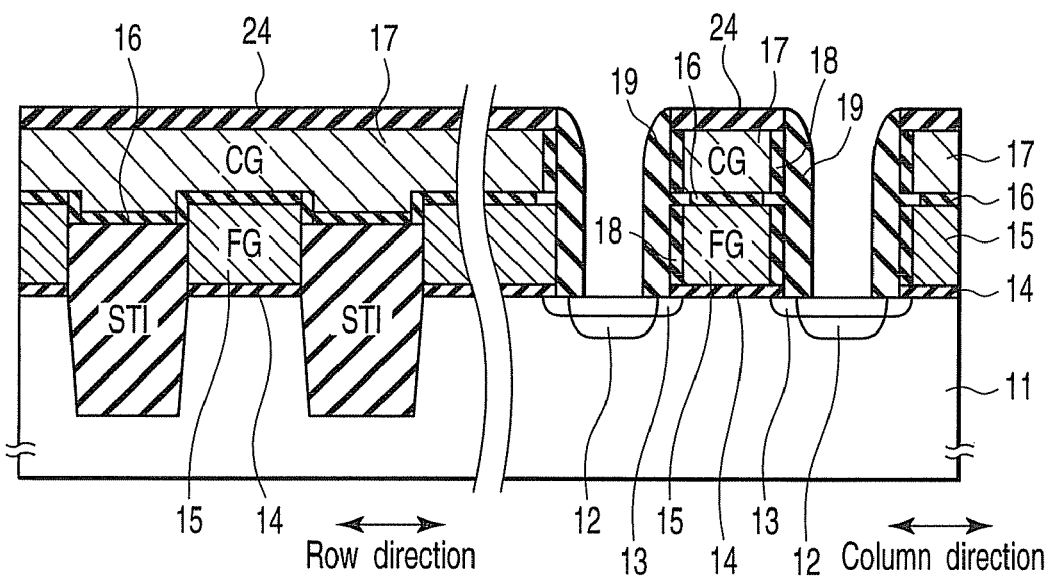
FIG. 27 is a sectional view showing one step of the manufacturing method.

When the insulating film 19A shown in FIG. 25 is etched by RIE, as shown in FIG. 27, the side-wall insulating film 19 is formed on the side surface of the floating gate electrode (FG) 15 and the side surface of the control gate electrode (CG) 17.

When an impurity is injected into the semiconductor substrate 11 in a self-alignment manner by an ion injection method using the floating gate electrode (FG) 15, the control gate electrode (CG) 17, and the side-wall insulating film 19 as masks, the source/drain diffusion layer 12 is formed.

Thereafter, wires such as bit lines and source lines are formed by a wiring step to complete a NAND cell unit in FIG. 7.

In the above manufacturing method, the oxidizing step (FIG. 24) is executed after the etching step (FIG. 23) for the inter-gate insulating film. However, in place of this, the etching step for the inter-gate insulating film may be executed after the oxidizing step is executed.

5. CONCLUSION

According to the example of the present invention, a coupling ratio can be improved without an increase in leakage current generated in an inter-gate insulating film and dielectric breakdown of the inter-gate insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a semiconductor substrate including first and second diffusion layers;
a channel formed between the first and second diffusion layers;
a gate insulating film formed on the channel;
a floating gate electrode formed on the gate insulating film, the floating gate electrode including an upper surface having a first upper end portion, a second upper end portion and a middle upper portion located between the first and second upper end portions;
a control gate electrode formed above the floating gate electrode, the control gate electrode including a bottom surface having a first bottom end portion facing to the first upper end portion, a second bottom end portion facing to the second upper end portion and a middle bottom portion facing to the middle upper portion and located between the first and second bottom end portions;
an inter-gate insulating film formed between the middle upper and middle bottom portions and absent in the first and second upper end potions and the first and second bottom end portions, the inter-gate insulating film having a first dielectric constant; and
additional insulating films formed between the first upper and the first bottom end portions and between the second upper and second bottom end portions, the additional insulating films including a second dielectric constant which is lower than the first dielectric constant.

2. The nonvolatile semiconductor memory according to claim 1, further comprising:
a side-wall insulating film formed on side surfaces of the floating and the control gate electrodes, the side-wall insulating film having the second dielectric constant and projection portion, as the additional insulating film, located between the first upper and first bottom end portions, as the additional insulating film, located between the first upper and the first bottom end portions and between the second upper and second bottom end portions.

3. The nonvolatile semiconductor memory according to claim 1,
wherein a distance d from the end portion of the inter-gate insulating film in the direction of channel length to the side surface of the floating gate electrode or the side surface of the control gate electrode is given by:

$$d=(1/2)EOT\_tol \times L/(Tphys-EOT\_IPD)$$

where EOT_tol is an allowable value of a fluctuation of EOT, L is a width of the floating gate electrode or the control gate electrode in the direction of channel length, EOT_IPD is EOT (equivalent oxide thickness) of the inter-gate insulating film, and Tphys is EOT of a material in an area extending from the end portion of the inter-gate insulating film to the side surface of the floating gate electrode or the side surface of the control gate electrode.

4. The nonvolatile semiconductor memory according to claim 1, wherein the floating gate electrode and the control gate electrode contain at least one of selected from the group consisting of conductive polysilicon, metal, and suicide.

5. The nonvolatile semiconductor memory according to claim 1, wherein edges of the floating gate electrode and the control gate electrode are rounded.

6. The nonvolatile semiconductor memory according to claim 1, wherein the inter-gate insulating film contains an insulating material having a dielectric constant higher than that of silicon oxide.

7. The nonvolatile semiconductor memory according to claim 1, wherein the inter-gate insulating film comprises a plurality of different insulating materials.

8. The nonvolatile semiconductor memory according to claim 1, wherein the first and second diffusion layers, the channel, the gate insulating film, the floating gate electrode, the inter-gate insulating film, and the control gate electrode comprise a memory cell of a NAND flash memory.

9. The nonvolatile semiconductor memory according to claim 8, wherein the first and second diffusion layers, the channel, the gate insulating film, the floating gate electrode, the inter-gate insulating film, and the control gate electrode comprise a selection transistor of a NAND flash memory.

10. A nonvolatile semiconductor memory comprising:
a semiconductor substrate including first and second diffusion layers;
a channel formed between the first and second diffusion layers;
a gate insulating film formed on the channel;
a floating gate electrode formed on the gate insulating film, the floating gate electrode including an upper surface having a first upper end portion, a second upper end portion, and a middle upper portion located between the first and second upper end portions;
a control gate electrode formed above the floating gate electrode, the control gate electrode including a bottom surface having a first bottom end portion facing to the first upper end portion, a second bottom end portion facing to the second upper end portion, and a middle bottom portion facing to the middle upper portion and located between the first and second bottom end portions;
an inter-gate insulating film formed between the middle upper and middle bottom portions and absent in the first and second upper end potions and the first and second bottom end portions; and
a side-wall insulating film formed on side surfaces of the floating and the control gate electrodes,
wherein a first void is formed among the side-wall insulating film, the inter-gate insulating film, the first upper end portion and the first bottom end portion, and a second void is formed among the side-wall insulating film, the inter-gate insulating film, the second upper end portion and the second bottom end portion.

11. The nonvolatile semiconductor memory according to claim 10, wherein the side-wall insulating film consists of silicon oxide.

12. The nonvolatile semiconductor memory according to claim 10, wherein the floating gate electrode and the control gate electrode contain at least one selected from the group consisting of conductive polysilicon, metal, and suicide.

13. The nonvolatile semiconductor memory according to claim 10, wherein the floating gate electrode and the control gate electrode consist of a plurality of different conductive materials.

14. The nonvolatile semiconductor memory according to claim 10, wherein edges of the floating gate electrode and the control gate electrode are rounded.

15. The nonvolatile semiconductor memory according to claim 10, wherein the inter-gate insulating film contains an insulating material having a dielectric constant higher than that of silicon oxide.

16. The nonvolatile semiconductor memory according to claim 10, wherein the inter-gate insulating film comprises a plurality of different insulating materials.

17. The nonvolatile semiconductor memory according to claim 10, wherein the first and second diffusion layers, the channel, the gate insulating film, the floating gate electrode, the inter-gate insulating film, and the control gate electrode comprise a memory cell of a NAND flash memory.

18. The nonvolatile semiconductor memory according to claim 17, wherein the first and second diffusion layers, the channel, the gate insulating film, the floating gate electrode, the inter-gate insulating film, and the control gate electrode comprise a selection transistor of a NAND flash memory.

* * * * *